United States Patent
Huang et al.

(10) Patent No.: US 9,413,318 B2
(45) Date of Patent: Aug. 9, 2016

(54) AUDIO-PLAYING SYSTEM AND METHOD FOR PROTECTING STORAGE MEDIUM OF ELECTRICAL DEVICE

(71) Applicant: COMPAL ELECTRONICS, INC., Taipei (TW)

(72) Inventors: Chien-Yu Huang, Taipei (TW); Po-Jung Chen, Taipei (TW); Shih-Hsuan Huang, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 285 days.

(21) Appl. No.: 13/917,661

(22) Filed: Jun. 14, 2013

(65) Prior Publication Data

US 2014/0072145 A1  Mar. 13, 2014

Related U.S. Application Data

(60) Provisional application No. 61/698,730, filed on Sep. 10, 2012.

(51) Int. Cl.
*H03G 3/00* (2006.01)
*H03G 3/20* (2006.01)
*H03G 3/30* (2006.01)
*H03G 5/00* (2006.01)

(52) U.S. Cl.
CPC .............. *H03G 3/20* (2013.01); *H03G 3/3089* (2013.01); *H03G 5/005* (2013.01)

(58) Field of Classification Search
CPC ................ G10H 3/188; G10H 1/0575; G10H 2250/451; G10H 1/0083; G10H 1/0091; G10H 1/02; G10H 1/44; G10H 3/18; H04R 25/502

USPC .......... 381/104–107, 66, 67, 56, 57, 59, 300, 381/304, 307
See application file for complete search history.

(56) References Cited

U.S. PATENT DOCUMENTS

| | | | |
|---|---|---|---|
| 6,256,273 B1 * | 7/2001 | Matsuda et al. ............ | 369/44.27 |
| 8,159,775 B2 * | 4/2012 | Armendariz ........... | G11B 33/08 |
| | | | 360/75 |
| 2005/0069153 A1 * | 3/2005 | Hall ....................... | H03G 5/025 |
| | | | 381/103 |

(Continued)

FOREIGN PATENT DOCUMENTS

| | | |
|---|---|---|
| CN | 101142620 A | 3/2008 |
| EP | 1850343 A1 | 10/2007 |

(Continued)

*Primary Examiner* — Lun-See Lao
(74) *Attorney, Agent, or Firm* — CKC & Partners Co., Ltd.

(57) ABSTRACT

The present invention discloses an audio playing system for protecting a storage medium of an electrical device. The audio playing system includes a detecting unit, a processing unit, an adjusting module and a playing module. The detecting unit detects vibration of the electrical device to generate a detection signal corresponding to the vibration. The processing unit compares the detection signal with the tolerable vibration value of the storage medium to generate a comparison result, and generates an adjustment signal according to the comparison result. The adjusting module adjusts an audio file according to the adjustment signal to generate an adjusted audio file. The playing module plays the adjusted audio file. The present invention also discloses an audio playing method for protecting a storage medium of an electrical device.

12 Claims, 3 Drawing Sheets

(56) References Cited

U.S. PATENT DOCUMENTS

| | | |
|---|---|---|
| 2006/0109581 A1 | 5/2006 | Lee et al. |
| 2009/0021858 A1 | 1/2009 | Fu et al. |
| 2009/0161887 A1* | 6/2009 | Yamaguchi .................. 381/98 |
| 2010/0290145 A1 | 11/2010 | Ahmad et al. |
| 2013/0003982 A1* | 1/2013 | Lin et al. .................. 381/59 |

FOREIGN PATENT DOCUMENTS

| | | |
|---|---|---|
| TW | M270464 | 7/2005 |
| TW | 200907944 A | 2/2009 |

* cited by examiner

AUDIO-PLAYING SYSTEM AND METHOD FOR PROTECTING STORAGE MEDIUM OF ELECTRICAL DEVICE

RELATED APPLICATIONS

This application claims priority to U.S. Provisional Application Ser. No. 61/698,730, filed Sep. 10, 2012, which is herein incorporated by reference.

BACKGROUND

1. Technical Field

The present invention relates to an audio playing system and method for protecting a storage medium of an electrical device.

2. Description of Related Art

With the advent of digital era, it comes a trend of digitalizing all kinds of information in daily life. Accordingly, electrical devices have become an essential interface for modern people to acquire information, knowledge or to communicate with other people.

In the electrical devices, a hard drive is widely adopted as a storage medium. Generally, the hard drive has a rotatable rigid disk with a flat magnetic surface capable of storing and retrieval data. In addition, the hard drive may further include a magnetic head disposed in close proximity to the surface of the disk for reading information stored thereon. When the hard drive is shocked, the magnetic head may vibrate and damage the data stored in the disk on impact.

Playing an audio dip is one of the most basic functions for the electrical device. However, when the electrical device playing the audio clip stored therein, it may cause resonance on its peripheral hardware and it's the housing case, which introduces the vibration of and causes the on the disk.

Hence, how to protect the data stored in the hard drive from the vibration of the disk is still an urgent need.

SUMMARY

According to one embodiment of this invention, an audio playing system for protecting a storage medium, which has a tolerable vibration value, of an electrical device is disclosed. The audio playing system plays an audio file for adjustment according to a detected vibration. The audio playing system includes a detecting unit, a processing unit, an adjusting module and a playing module. The processing unit is electrically connected with the detecting unit. The detecting unit detects vibration of the electrical device to generate a detection signal corresponding to the vibration. The processing unit compares the detection signal with the tolerable vibration value of the storage medium to generate a comparison result, and generates an adjustment signal according to the comparison result. The adjusting module adjusts an audio file according to the adjustment signal to generate an adjusted audio file. The playing module plays the adjusted audio file.

According to another embodiment of this invention, an audio playing method for protecting a storage medium of an electrical device is disclosed. The storage medium has a tolerable vibration value. The audio playing method includes the following steps:

(a) Vibration of the electrical device is detected to generate a detection signal corresponding to the vibration.

(b) The detection signal is compared with the tolerable vibration value to generate a comparison result, and an adjustment signal is generated according to the comparison result.

(c) An audio file adjusted according to the adjustment signal to generate an adjusted audio file.

(d) The adjusted audio file is played utilizing a playing module.

These and other features, aspects, and advantages of the present invention will become better understood with reference to the following description and appended claims. It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
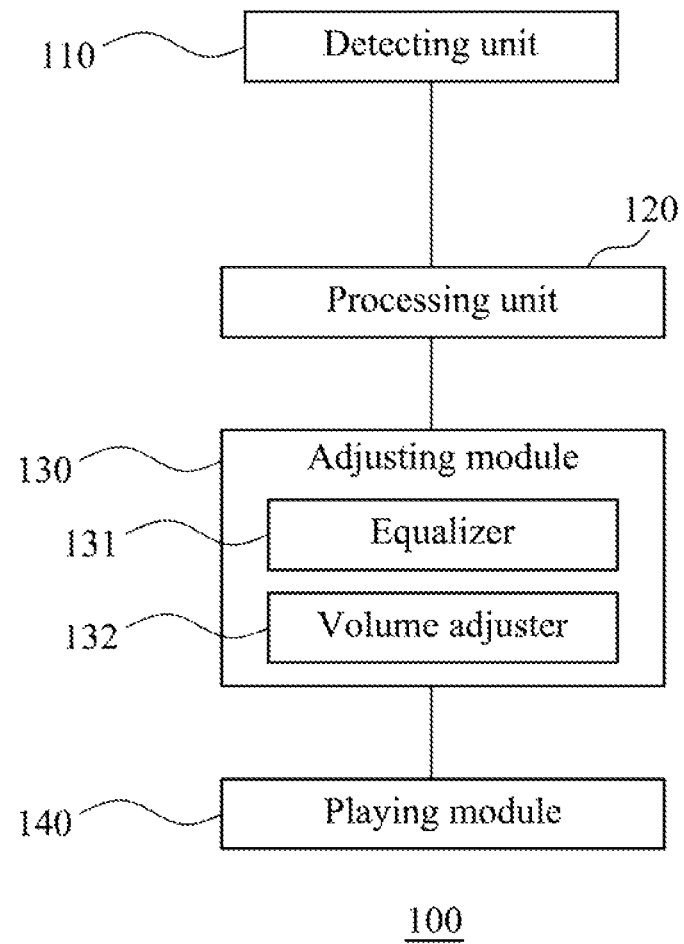
FIG. 1 illustrates a block diagram of an audio playing system for protecting a storage medium of an electrical device according to an embodiment of this invention.

Reference will now be made in detail to the present embodiments of the invention, examples of which are illustrated in the accompanying drawings. Wherever possible, the same reference numbers are used in the drawings and the description to refer to the same or like parts.

FIG. 1 illustrates a block diagram of an audio playing system for protecting a storage medium of an electrical device according to an embodiment of this invention. The audio playing system 100 plays audio file for adjustment according to the detected vibration. The storage medium may be a hard drive or SSD (Solid State Drive) or any other type of the storage medium.

The audio playing system 100 is applied to protect a storage medium of an electrical device. Wherein, the storage medium has a tolerable vibration value, which includes at least one value of tolerable vibration of the storage medium in at least one frequency domain.

The audio playing system 100 includes a detecting unit 110, a processing unit 120, an adjusting module 130 and a playing module 140. The processing unit 120 is electrically connected with the detecting unit 110. Wherein, the processing unit 120, the adjusting module 130 and the playing module 140 can be implemented by a central processing unit (CPU), a codec or any other type of processing unit of the electrical device to be protected.

The detecting unit 110 detects vibration of the electrical device to generate a detection signal corresponding to the vibration. The detecting unit 110 may be a g sensor or any other type of detecting unit, which is capable of detecting vibration. In some embodiments of this invention, the detecting unit 110 is disposed on or near the storage medium or a main board of the electrical device to be protected.

The processing unit 120 compares the detection signal with the tolerable vibration value of the storage medium to generate a comparison result, and generates an adjustment signal according to the comparison result. The adjusting module 130 adjusts an audio file according to the adjustment signal to generate an adjusted audio file. In some embodiments of this invention, the adjusting module 130 may directly keeps on adjusting the audio file according to the adjustment signal to generate an adjusted audio file. In some other embodiments of this invention, the adjusting module 130 adjusts an initial audio source signal of the original audio file to generate the adjusted audio file. The playing module 140 plays the adjusted audio file.

In addition, the audio file mentioned in this invention may follow an audio file format, such as Compact Disk Audio Track (CDA), Waveform Audio File Format (WAV), MPEG-1 or MPEG-2 Audio Layer III (MP3), Advanced Audio Coding (AAC), OGG, Musical Instrument Digital Interface (MIDI) or any other audio format. Moreover, the audio file mentioned in this invention may be an audio data part of a multimedia file. Accordingly, since the electrical device plays the adjusted audio file of audio or video, the storage medium of the electrical device can be protected from damage caused by the resonance of the played audio file.

Figure 2:
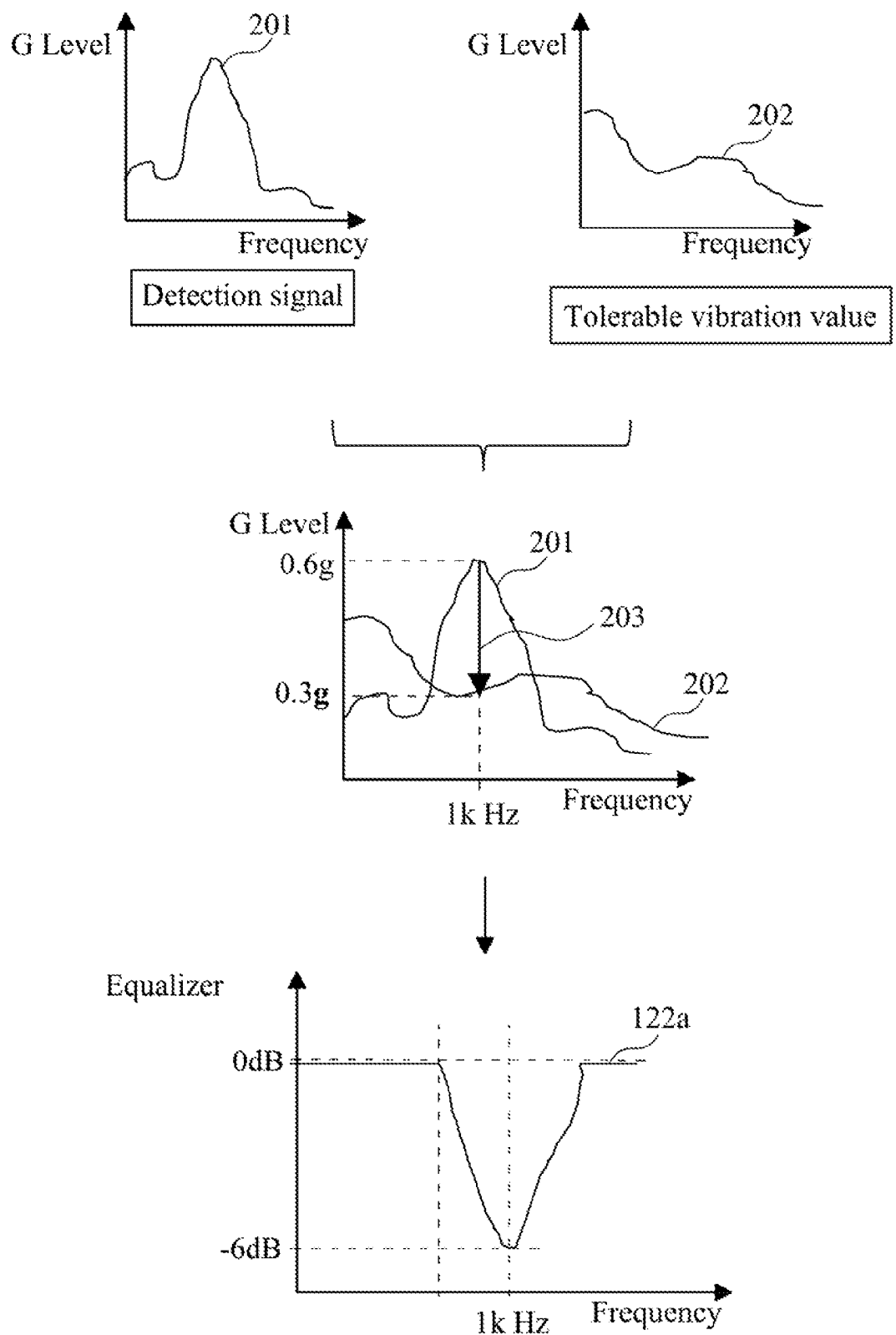
FIG. 2 shows an embodiment of adjustment utilizing the equalizer 131.

In some embodiments of this invention, an equalizer can be utilized for adjustment. Hence, the adjusting module 130 may include an equalizer 131. The equalizer 131 utilizes the adjustment signal to adjust the audio file for generating the adjusted audio file. Referring to FIG. 2, which shows an embodiment of adjustment utilizing the equalizer 131. In this embodiment, the detecting unit 110 detects vibration of the electrical device to generate a detection signal 201 corresponding to the vibration. The processing unit 120 compares the detection signal 201 with the tolerable vibration value 202 of the storage medium to generate a comparison result 203. The comparison result 203 shows that the vibration in the frequency domain 1 kHz exceeds the tolerable vibration value 202 of the storage medium. Accordingly, the processing unit 120 generates an adjustment signal according to the comparison result 203 for the equalizer 131 to adjust the frequency domain 1 kHz of the audio file. Then, The adjusting module 130 can utilize the equalizer 131 to adjust the audio file according to the adjustment signal to generate the adjusted audio file.

In another embodiment of this invention, the adjusting module 130 may include a volume adjuster 132. The volume adjuster 132 adjusts a volume of the audio file according to the adjustment signal for generating the adjusted audio file. For example, the volume adjuster 132 may reduce the volume of the audio file to conform to the tolerable vibration value of the storage medium to be protected.

In some embodiments of this invention, the playing module 140 is a speaker. Hence, the adjusted audio file may be played by the speaker.

In some other embodiments of this invention, the playing module 140 is an audio output port. Hence, the audio output port may output the adjusted audio file to an external player for being played.

Figure 3:
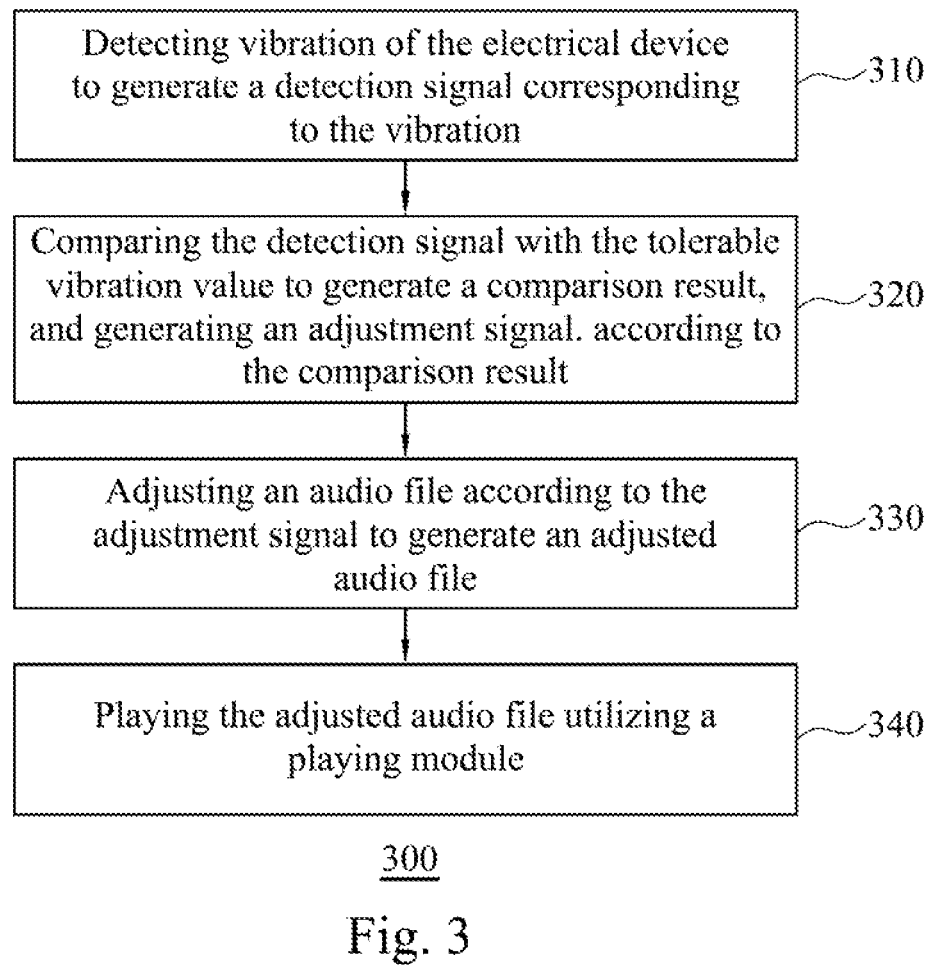
FIG. 3 is a flow diagram of an audio playing method for protecting a storage medium of an electrical device according to one embodiment of this invention.

Referring to FIG. 3, a flow diagram will be described that illustrates an audio playing method for protecting a storage medium of an electrical device according to one embodiment of this invention. The audio playing method may take the form of a computer program product stored on a non-transitory computer-readable storage medium having computer-readable instructions embodied in the medium. Any suitable storage medium may be used including non-volatile memory such as read only memory (ROM), programmable read only memory (PROM), erasable programmable read only memory (EPROM), and electrically erasable programmable read only memory (EEPROM) devices; volatile memory such as static random access memory (SRAM), dynamic random access memory (DRAM), and double data rate random access memory (DDR-RAM); optical storage devices such as compact disc read only memories (CD-ROMs) and digital versatile disc read only memories (DVD-ROMs); and magnetic storage devices such as hard disk drives (HDD) and floppy disk drives.

The audio playing method 300 is applied to protect a storage medium of an electrical device. Wherein, the storage medium has a tolerable vibration value, which includes at least one value of tolerable vibration of the storage medium in at least one frequency domain. The audio playing method 300 includes the following steps:

At step 310, vibration of the electrical device is detected to generate a detection signal corresponding to the vibration.

At step 320, the detection signal is compared with the tolerable vibration value to generate a comparison result, and an adjustment signal is generated according to the comparison result.

At step 330, an audio file is adjusted according to the adjustment signal to generate an adjusted audio file.

At step 340, the adjusted audio file is played utilizing a playing module. In some embodiments of step 340, a speaker disposed in the electrical device can be taken as the playing module for playing the adjusted audio file. In some other embodiments of step 340, an external player connected to the electrical device can be taken as the playing module for outputting/playing the adjusted audio file. Accordingly, since the adjusted audio file is played, the storage medium of the electrical device can be protected from damage caused by the resonance of the played audio file.

In some embodiments of step 330, an equalizer can be utilized to adjust the audio file according to the adjustment signal to generate the adjusted audio for playing at step 340.

In some other embodiments of step 330, the volume of the audio file can be adjusted according to the adjustment signal to generate the adjusted audio file for playing at step 340.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An audio playing system for protecting a storage medium of an electrical device, the storage medium having a tolerable vibration value, and the audio playing system comprising:

a detecting unit configured to detect vibration of the electrical device to generate a detection signal corresponding to the vibration;

a processing unit electrically connected with the detecting unit, the processing unit configured to compare the detection signal with the tolerable vibration value to generate a comparison result, and to generate an adjustment signal according to the comparison result, wherein the tolerable vibration value includes an information associated with acceptable vibration values in different frequencies and the comparison result shows that the detection signal exceeds on the acceptable vibration values in at least one frequency;

an adjusting module configured to adjust the at least one frequency of an audio file according to the adjustment signal to generate an adjusted audio file; and a playing module configured to play the adjusted audio file.

2. The audio playing system of claim 1, wherein the adjusting module comprises an equalizer configured to utilize the adjustment signal to adjust the at least one frequency the audio file for generating the adjusted audio file.

3. The audio playing system of claim 1, wherein the adjusting module comprises a volume adjuster configured to adjust a volume of the audio file according to the adjustment signal for generating the adjusted audio file.

4. The audio playing system of claim 1, wherein the playing module is a speaker, and the speaker plays the adjusted audio file.

5. The audio playing system of claim wherein the playing module is an audio output port configured to output the adjusted audio file to an external player for being played.

6. The audio playing system of claim 1, wherein the detecting unit is a g sensor.

7. The audio playing system of claim 1, wherein the detecting unit is disposed near the storage medium or a main board of the electrical device.

8. The audio playing system of claim 1, wherein the adjusting module keeps on adjusting the audio file for generating the adjusted audio file.

9. The audio playing system of claim 1, wherein the adjusting module adjusts an initial audio source signal of the audio file to generate the adjusted audio file.

10. An audio playing method for protecting a storage medium of an electrical device, wherein the storage medium has a tolerable vibration value, and the audio playing method comprises:

(a) detecting vibration of the electrical device to generate a detection signal corresponding to the vibration;

(b) comparing the detection signal with the tolerable vibration value to generate a comparison result, and generating an adjustment signal according to the comparison result, wherein the tolerable vibration value includes an information associated with acceptable vibration values in different frequencies and the comparison result shows that the detection signal exceeds the one of the acceptable vibration values in at least one frequency;

(c) adjusting the at least one frequency of an audio file according to the adjustment signal to generate an adjusted audio file; and (d) playing the adjusted audio file utilizing a playing module.

11. The audio playing method of claim 10, wherein step (c) comprises:

utilizing an equalizer to adjust the at least one frequency of the audio file according to the adjustment signal to generate the adjusted audio file.

12. The audio playing method of claim 10, Therein step (c) comprises:

adjusting a volume of the audio file according to the adjustment signal for generating the adjusted audio file.

* * * * *